US012805115B2

(12) United States Patent
Purvis, II et al.

(10) Patent No.: US 12,805,115 B2
(45) Date of Patent: Nov. 17, 2026

(54) DOPED SINGLE CRYSTAL OLEDS

(71) Applicants: Meta Platforms Technologies, LLC, Menlo Park, CA (US); REGENTS OF THE UNIVERSITY OF MINNESOTA, Minneapolis, MN (US)

(72) Inventors: Lafe Joseph Purvis, II, Redmond, WA (US); Russell J. Holmes, Chanhassen, MN (US); Tingling Rao, Bellevue, WA (US); Andrew John Ouderkirk, Kirkland, WA (US); Kimberly Kay Childress, Duvall, WA (US); Sang Gil Youm, Minneapolis, MN (US); Carl Daniel Frisbie, Menlo Park, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 409 days.

(21) Appl. No.: 18/543,061

(22) Filed: Dec. 18, 2023

(65) Prior Publication Data

US 2025/0081719 A1 Mar. 6, 2025

Related U.S. Application Data

(60) Provisional application No. 63/579,408, filed on Aug. 29, 2023.

(51) Int. Cl.
*H10K 50/12* (2023.01)
*H10K 85/60* (2023.01)

(52) U.S. Cl.
CPC ........... *H10K 50/12* (2023.02); *H10K 85/633* (2023.02)

(58) Field of Classification Search
None
See application file for complete search history.

(56) References Cited

U.S. PATENT DOCUMENTS

| | | | |
|---|---|---|---|
| 8,062,769 B2 | 11/2011 | Kai et al. | |
| 9,312,496 B2 | 4/2016 | Sawada et al. | |
| 2012/0299474 A1 | 11/2012 | Tang et al. | |
| 2019/0081264 A1* | 3/2019 | Yun | H10K 59/38 |

OTHER PUBLICATIONS

An M.H., et al., "Controllable Molecular Doping in Organic Single Crystals Toward High-efficiency Light-emitting Devices," Organic Electronics, Feb. 10, 2021, vol. 91, 7 Pages, Retrieved from the Internet URL: https://pdf.sciencedirectassets.com/272178/1-s2.0-S156611992IX00031/1-s2.0-S1566119921000029X/main.pdf?X-Amz-SecurityToken=IQoJb3JpZ2luX2VjEHkaCXVzLWVhc3QtMSJGMEQCIHodyN135vV1T3naPk97/aH9hv8rc5M6+r4PmGAYhsENAiAXutVEH2vSNAdFfkyLgDgj/.

Ding R., et al., "High-color-rendering and High-efficiency White Organic Light-emitting Devices Based on Double-doped Organic Single Crystals," Advanced Functional Materials, Feb. 4, 2019, vol. 29, No. 12, 8 Pages.

Extended European Search Report for European Patent Application No. 24177477.7, mailed Nov. 15, 2024, 11 pages.

Xin J., et al., "Doped Crystalline Thin-film Deep-blue Organic Light-emitting Diodes," Journal of Materials Chemistry C, Feb. 17, 2021, vol. 9, No. 7, pp. 2236-2242, Retrieved from the Internet URL: https://pubs.rsc.org/en/content/articlepdf/2021/tc/d0tc05934j.

* cited by examiner

*Primary Examiner* — Kyoung Lee
(74) *Attorney, Agent, or Firm* — Greenberg Traurig, LLP

(57) ABSTRACT

A device includes a light-emitting diode having an emissive surface, where the emissive surface includes a doped organic solid crystal. The light-emitting diode may include an organic light-emitting diode (OLED). The doped organic solid crystal may be a single crystal.

17 Claims, 9 Drawing Sheets

DOPED SINGLE CRYSTAL OLEDS

CROSS-REFERENCE TO RELATED APPLICATION

This application claims the benefit of priority under 35 U.S.C. § 119(e) of U.S. Provisional Application No. 63/579,408, filed Aug. 29, 2023, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
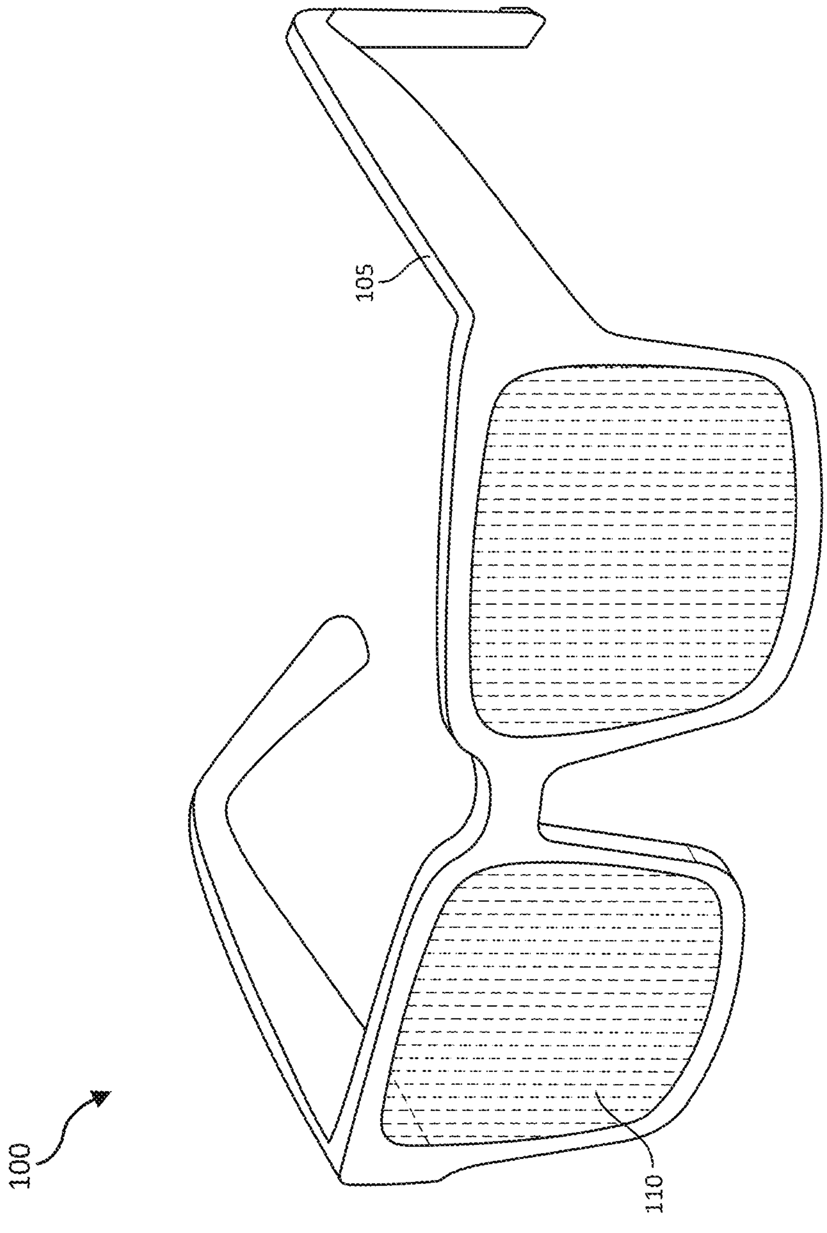
FIG. 1 is a diagram of a head-mounted display (HMD) that includes a near-eye display (NED) according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

Optical displays are ubiquitous in emerging technologies, including wearable devices, smart phones, tablets, laptops, desktop computers, and other display systems. Many display systems used in such technologies are based on light-emitting diodes (LEDs), including organic light-emitting diodes (OLEDs). The present disclosure relates generally to display systems and, more specifically, to organic light-emitting diode (OLED)-based displays, including micro OLED-based displays and their methods of manufacture.

In accordance with various embodiments, a display system may include a display panel having an array of individual LED display elements defining an active area. One or more LED display elements can be grouped to form pixels. Each of the plurality of pixels may include an organic light-emitting diode (OLED) and suitable control circuitry configured to generate and distribute control signals to selectively illuminate the pixels to project an image.

The display system may further include a semiconducting backplane that underlies the display panel. The backplane may provide structural support for the LED display elements and provide electrical connections to transmit the control signals to the light-emitting diodes. As will be appreciated, integration of the LED display elements with the backplane and control circuitry can affect pixel-level interconnects, including the size and density of a pixel array, and ultimately the quality, performance, and cost of the display system.

Whereas light sources such as organic light-emitting diodes (OLEDs) are key components of a display in an AR/VR system, important performance metrics are the quantum efficiency and the light extraction efficiency of the light source, which are measures of how efficiently photons are generated within the diode and extracted out of the device. Photons generated within the OLED can be lost to many phenomena, including surface plasmon polariton modes, waveguide (WG) modes, and absorption within the device, etc.

Disclosed herein are OLED display structures that include an emissive layer configured to improve light generation efficiency. According to various embodiments, the emissive layer may include one or more layers of a suitably doped organic solid crystal (OSC). The crystal structure and the attendant refractive index of the OSC layer(s) (i.e., with respect to the refractive indices of organic layers within the OLED, for example) can be used to improve the light extraction efficiency of the device, including the generation and emission of light having a preferred polarization.

Organic solid crystal thin films may be implemented as a single layer or multilayer architecture. A multilayer thin film that includes plural layers of an organic solid crystal material may include a plurality of biaxially oriented organic solid material layers. Each biaxial layer may be characterized by three mutually orthogonal refractive indices ($n_1$, $n_2$, $n_3$) where $n_1 \neq n_2 \neq n_3$.

According to particular embodiments, a multilayer organic solid thin film may be incorporated into a light source such as an OLED to improve light extraction efficiency. By aligning (i.e., rotating) each layer in plane with respect to an adjacent layer, such biaxially oriented multilayer thin films may enable higher signal efficiency and greater ghost image suppression than architectures using comparative materials. Organic solid thin films can also be used in various projectors as a brightness enhancement layer.

One or more source materials may be used to form an organic solid thin film, including a multilayer thin film. Example organic materials include various classes of crystallizable organic semiconductors. In accordance with various embodiments, organic semiconductors may include small molecules, macromolecules, liquid crystals, organometallic compounds, oligomers, and polymers. Organic semiconductors may include p-type, n-type, or ambipolar polycyclic aromatic hydrocarbons, such as carbon 60, anthracene, tetracene, phenanthrene, tolane, pyrene, corannulene, fluorene, biphenyl, and ter-phenyl.

Example compounds may include cyclic, linear and/or branched structures, which may be saturated or unsaturated, and may additionally include heteroatoms and/or saturated or unsaturated heterocycles, such as furan, pyrrole, thiophene, pyridine, pyrimidine, piperidine, quinolines, benzothiophenes, benzopyrans, bent and asymmetric acenes, 2,6-naphthalene dicarboxylic acid, and 2,6-dimethyl carboxylic esters.

Heteroatoms may include fluorine, chlorine, nitrogen, oxygen, sulfur, phosphorus, as well as various metals. Suitable feedstock for molding solid organic semiconductor materials may include neat organic compositions, melts, solutions, or suspensions containing one or more of the organic materials disclosed herein.

An organic solid crystal may, in some embodiments, include a functional group such as an amine, alcohol, or carboxylic acid.

Structurally, the disclosed organic materials, as well as the thin films derived therefrom, may be single crystal, polycrystalline, or glassy. Organic solid crystals may include closely packed structures (e.g., organic molecules) that exhibit desirable optical properties such as a high and tunable refractive index, and high birefringence. Anisotropic organic solid materials may include a preferred packing of molecules or a preferred orientation or alignment of molecules.

Such organic solid crystal (OSC) materials may provide functionalities, including phase modulation, beam steering, wave-front shaping and correction, optical communication, optical computation, holography, and the like. Due to their optical and mechanical properties, organic solid crystals may enable high-performance devices, and may be incorporated into passive or active optics, including AR/VR headsets, and may replace comparative material systems such as polymers, inorganic materials, and liquid crystals. In certain aspects, organic solid crystals may have optical properties that rival those of inorganic crystals while exhibiting the processability and electrical response of liquid crystals.

Due to their relatively low melting temperature, organic solid crystal materials may be molded to form a desired structure. Molding processes may enable complex architectures and may be more economical than the cutting, grinding, and polishing of bulk crystals. In one example, a single crystal or polycrystalline shape such as a sheet or cube may be partially or fully melted into a desired form and then controllably cooled to form a single crystal having a new shape.

A process of molding an optically anisotropic crystalline or partially crystalline thin film, for example, may include operational control of the thermodynamics and kinetics of nucleation and crystal growth. In certain embodiments, a temperature during molding proximate to a nucleation region of a mold may be less than a melting onset temperature ($T_m$) of a molding composition, while the temperature remote from the nucleation region may be greater than the melting onset temperature. Such a temperature gradient paradigm may be obtained through a spatially applied thermal gradient, optionally in conjunction with a selective melting process (e.g., laser, soldering iron, etc.) to remove excess nuclei, leaving few nuclei (e.g., a single nucleus) for crystal growth.

To promote nucleation and crystal growth, a selected temperature and temperature gradient may be applied to a crystallization front of a nascent thin film. For instance, the temperature and temperature gradient proximate to the crystallization front may be determined based on the selected feedstock (i.e., molding composition), including its melting temperature, thermal stability, and rheological attributes.

A suitable mold for molding an organic solid thin film may be formed from a material having a softening temperature or a glass transition temperature ($T_g$) greater than the melting onset temperature ($T_m$) of the molding composition. The mold may include any suitable material, e.g., silicon, silicon dioxide, fused silica, quartz, glass, nickel, silicone, siloxanes, perfluoropolyethers, polytetrafluoroethylenes, perfluoroalkoxyalkanes, polyimide, polyethylene naphthalate, polyvinylidene fluoride, polyphenylene sulfide, and the like.

An epitaxial or non-epitaxial growth process may be used to form an organic solid crystal (OSC) layer over a suitable substrate or mold. A seed crystal for encouraging crystal nucleation and an anti-nucleation layer configured to locally inhibit nucleation may collectively promote the formation of a limited number of crystal nuclei within one or more specified location(s), which may in turn encourage the formation of larger, contiguous organic solid crystals. In some embodiments, a nucleation-promoting layer or seed crystal may itself be configured as a thin film.

Example nucleation-promoting or seed materials may include one or more metallic or inorganic elements or compounds, such as Pt, Ag, Au, Al, Pb, indium tin oxide, $SiO_2$, and the like. Further example nucleation-promoting or seed crystal materials may include organic compounds, such as a polyimide, polyamide, polyurethane, polyurea, polythiolurethane, polyethylene, polysulfonate, polyolefin, as well as mixtures and combinations thereof. In some examples, a nucleation-promoting material may be configured as a textured or aligned layer, such as a rubbed polyimide or photoalignment layer, which may be configured to induce directionality or a preferred orientation to an over-formed organic solid crystal thin film.

An example method for manufacturing an organic solid crystal thin film includes providing a mold, forming a layer of a nucleation-promoting material over at least a portion of a surface of the mold, and depositing a layer of molten feedstock over the surface of the mold and in contact with the layer of the nucleation-promoting material, while maintaining a temperature gradient across the layer of the molten feedstock.

An anti-nucleation layer may include a dielectric material. In further embodiments, an anti-nucleation layer may include an amorphous material. In example processes, crystal nucleation may occur independent of the substrate or mold.

In some embodiments, a surface treatment or release layer disposed over the substrate or mold may be used to control nucleation and growth of the organic solid crystal (OSC) and later promote separation and harvesting of a bulk crystal or thin film. For instance, a coating having a solubility parameter mismatch with the deposition chemistry may be applied to the substrate (e.g., globally or locally) to suppress interaction between the substrate and the crystallizing layer during the deposition process.

Example surface treatment coatings may include oleophobic coatings or hydrophobic coatings. A thin layer, e.g., monolayer or bilayer, of an oleophobic material or a hydrophobic material may be used to condition the substrate or mold prior to an epitaxial process. The coating material may be selected based on the substrate and/or the organic crystalline material. Further example surface treatment coating materials include siloxanes, fluorosiloxanes, phenyl siloxanes, fluorinated coatings, polyvinyl alcohol, and other OH bearing coatings, acrylics, polyurethanes, polyesters, polyimides, and the like.

In some embodiments, a release agent may be applied to an internal surface of the mold and/or combined with the molding composition. A surface treatment of an inner surface of the mold may include the chemical bonding or physical adsorption of small molecules, or polymers/oligomers having linear, branched, dendritic, or ringed structures, that may be functionalized or terminated, for example, with fluorinated groups, silicones, or hydrocarbon groups.

A buffer layer may be formed over the deposition surface of a substrate or mold. A buffer layer may include a small molecule that may be similar to or even equivalent to the small molecule forming the organic solid crystal, e.g., an anthracene single crystal. A buffer layer may be used to tune one or more properties of the deposition/growth surface of the substrate or mold, including surface energy, wettability, crystalline or molecular orientation, etc.

A further example method for manufacturing an organic solid crystal thin film includes forming a layer of a molecular feedstock over a surface of a mold, the molecular feedstock including crystallizable organic molecules, forming a selected number of crystal nuclei from the organic molecules within a nucleation region of the molecular feedstock layer, and growing the selected number of crystal nuclei to form an organic solid crystal thin film. In some embodiments, the selected number of crystal nuclei may be one. Crystal growth may be controlled using an isothermal process, slow cooling, and zone annealing.

In some embodiments, an additive may be used to encourage the growth of a single crystal and/or its release from the mold. In some embodiments, in addition to the precursor (i.e., crystallizable organic molecules) for the organic solid crystal, a molecular feedstock may include an additive selected from polymers, oligomers, and small molecules, where the additive may have a melting onset temperature of at least 20° C. less than a melting onset temperature of the organic solid crystal precursor, e.g., 20° C., 30° C., or even 40° C. less than the melting onset temperature of the molding composition. An additive may promote crystal growth and the formation of a large crystal size. In some embodiments, an additive may be integrated with a molding process to improve the characteristics of a molded organic solid thin film, including its surface roughness.

During the act of molding, and in accordance with particular embodiments, a cover plate may be applied to a free surface of the organic solid crystal thin film. The cover plate may be oriented at an angle with respect to a major surface of the thin film. A force may be applied to the cover plate to generate capillary forces that facilitate mass transport of the molten feedstock, i.e., between the cover plate and the substrate and in the direction of a crystallization front of a growing crystalline thin film. In some embodiments, such as through vertical orientation of the deposition system, the force of gravity may contribute to mass transport and the delivery of the molten feedstock to the crystallization front. Suitable materials for the cover plate and the substrate may independently include silicon dioxide, fused silica, high index glasses, high index inorganic crystals, and high melting temperature polymers (e.g., siloxanes, polyimides, PTFE, PFA, etc.), although further material compositions are contemplated.

According to particular embodiments, a method of forming an organic solid crystal (OSC) may include contacting an organic precursor (i.e., crystallizable organic molecules) with a non-volatile medium material, forming a layer including the organic precursor over a surface of a substrate or mold, and processing the organic precursor to form an organic crystalline phase, where the organic crystalline phase may include a preferred orientation of molecules.

The act of contacting the organic precursor with the non-volatile medium material may include forming a homogeneous mixture of the organic precursor and the non-volatile medium material. In further embodiments, the act of contacting the organic precursor with the non-volatile medium material may include forming a layer of the non-volatile medium material over a surface of a substrate or mold and forming a layer of the organic precursor over the layer of the non-volatile medium material.

In some embodiments, a non-volatile medium material may be disposed between the mold surface and the organic precursor and may be adapted to decrease the surface roughness of the molded organic thin film and promote its release from the mold while locally inhibiting nucleation of a crystalline phase. Example non-volatile medium materials include liquids such as silicone oil, a fluorinated polymer, a polyolefin and/or polyethylene glycol. Further example non-volatile medium materials may include crystalline materials having a melting temperature that is less than the melting temperature of the organic precursor material. In some embodiments the mold surface may be pre-treated in order to improve wetting and/or adhesion of the non-volatile medium material.

The substrate or mold may include a surface that may be configured to provide a desired shape to the molded organic solid thin film. For example, the substrate or mold surface may be planar, concave, or convex, and may include a three-dimensional architecture, such as surface relief gratings, or a curvature (e.g., compound curvature) configured to form microlenses, microprisms, or prismatic lenses. According to some embodiments, a substrate or mold geometry may be transferred and incorporated into a surface of an overformed organic solid crystal thin film. For the sake of convenience, the terms "substrate" and "mold" may be used interchangeably herein unless the context indicates otherwise.

The deposition surface of a substrate or mold may include a functional layer that is configured to be transferred to the organic solid crystal after formation of the organic solid crystal and its separation from the substrate or mold. Functional layers may include an interference coating, an AR coating, a reflectivity enhancing coating, a bandpass coating, a band-block coating, blanket or patterned electrodes, etc. By way of example, an electrode may include any suitably electrically conductive material such as a metal, a transparent conductive oxide (TCO) (e.g., indium tin oxide or indium gallium zinc oxide), or a metal mesh or nanowire matrix (e.g., including metal nanowires or carbon nanotubes).

In lieu of, or in addition to, molding, further example deposition methods for forming organic solid crystals include vapor phase growth, solid state growth, melt-based growth, solution growth, etc., optionally in conjunction with a suitable substrate and/or seed crystal. A substrate may be organic or inorganic. By way of example, thin film solid organic materials may be manufactured using one or more processes selected from chemical vapor deposition and physical vapor deposition. Further coating processes, e.g., from solution or a melt, may include 3D printing, ink jet printing, gravure printing, doctor blading, spin coating, and the like. Such processes may induce shear during the act of coating and accordingly may contribute to crystallite or molecular alignment and a preferred orientation of crystallites and/or molecules within an organic solid crystal thin film. A still further example method may include pulling a free-standing crystal from a melt. According to some embodiments, solid-, liquid-, or gas-phase deposition processes may include epitaxial processes.

As used herein, the terms "epitaxy," "epitaxial" and/or "epitaxial growth and/or deposition" refer to the nucleation and growth of an organic solid crystal on a deposition surface where the organic solid crystal layer being grown assumes the same crystalline habit as the material of the deposition surface. For example, in an epitaxial deposition process, chemical reactants may be controlled, and the system parameters may be set so that depositing atoms or molecules alight on the deposition surface and remain sufficiently mobile via surface diffusion to orient themselves according to the crystalline orientation of the atoms or molecules of the deposition surface. An epitaxial process may be homogeneous or heterogeneous.

In accordance with various embodiments, the optical and electrooptical properties of an organic solid crystal thin film may be tuned using doping and related techniques. Doping may influence one or more of the polarizability, photoluminescence, and electroluminescence of an organic solid crystal, for example. The introduction of dopants, i.e., impurities, into an organic solid crystal, may influence, for example, the highest occupied molecular orbital (HOMO) and lowest unoccupied molecular orbital (LUMO) bands and hence the band gap thereof, induced dipole moment, and/or molecular/crystal polarizability.

Doping may be performed in situ, i.e., during epitaxial growth. A dopant may be incorporated into a feedstock, for example. In exemplary embodiments, doping may be used to modify the electronic structure and therefore at least one optical property of an organic solid crystal without damaging molecular packing or the crystal structure itself.

Doping changes the electron and hole carrier concentrations of a host material at thermal equilibrium. A doped organic solid crystal may be p-type or n-type. As used herein, "p-type" refers to the addition of impurities to an organic solid crystal that create a deficiency of valence electrons, whereas "n-type" refers to the addition of impurities that contribute free electrons to an organic solid crystal. Without wishing to be bound by theory, doping may influence "π-stacking" and "π-π interactions" within an organic solid crystal.

Example dopants include Lewis acids (electron acceptors) and Lewis bases (electron donors). Particular examples include charge-neutral and ionic species, e.g., Brønsted acids and Brønsted bases, which in conjunction with the aforementioned processes may be incorporated into an organic solid crystal by solution growth or co-deposition from the vapor phase. In particular embodiments, a dopant may include an organic molecule, an organic ion, an inorganic molecule, or an inorganic ion. A doping profile may be homogeneous or localized to a particular region (e.g., depth or area) of an organic solid crystal.

During nucleation and growth, the orientation of the in-plane axes of an OSC thin film may be controlled using one or more of substrate temperature, deposition pressure, solvent vapor pressure, or non-solvent vapor pressure. High refractive index and highly birefringent organic solid thin films may be supported by a substrate or mold or removed therefrom to form a free-standing thin film. A substrate, if used, may be rigid or deformable.

Example processes may be integrated with a real-time feedback loop that is configured to assess one or more attributes of the organic solid crystal and accordingly adjust one or more process variables, including melt temperature, mold temperature, feedstock injection rate into a mold, etc.

Following deposition, an OSC thin film may be diced and polished to achieve a desired form factor and surface quality. Dicing may include diamond turning, for example, although other cutting methods may be used. Polishing may include chemical mechanical polishing. In some embodiments, a chemical or mechanical surface treatment may be used to create structures on a surface of an OSC thin film. Example surface treatment methods include diamond turning and photolithography and etch processes. In some embodiments, a cover plate or substrate with reciprocal structures may be used to fabricate surface structures in an OSC thin film.

An organic thin film may include a surface that is planar, convex, or concave. In some embodiments, the surface may include a three-dimensional architecture, such as a periodic surface relief grating. In further embodiments, a thin film may be configured as a microlens or a prismatic lens. For instance, polarization optics may include a microlens that selectively focuses one polarization of light over another. In some embodiments, a structured surface may be formed in situ, i.e., during crystal growth of the organic solid crystal thin film over a suitably shaped mold. In further embodiments, a structured surface may be formed after crystal growth, e.g., using additive or subtractive processing, such as 3D printing or photolithography and etching. The nucleation and growth kinetics and choice of chemistry may be selected to produce a solid organic crystal thin film having areal (lateral) dimensions of at least approximately 1 cm.

The organic crystalline phase may be single crystal or polycrystalline. In some embodiments, the organic crystalline phase may include amorphous regions. In some embodiments, the organic crystalline phase may be substantially crystalline. The organic crystalline phase may be characterized by a refractive index along at least one principal axis of at least approximately 1.5 at 589 nm. By way of example, the refractive index of the organic crystalline phase at 589 nm and along at least one principal axis may be at least approximately 1.5, at least approximately 1.6, at least approximately 1.7, at least approximately 1.8, at least approximately 1.9, at least approximately 2.0, at least approximately 2.1, at least approximately 2.2, at least approximately 2.3, at least approximately 2.4, at least approximately 2.5, or at least approximately 2.6, including ranges between any of the foregoing values.

In some embodiments, the organic crystalline phase may be characterized by a birefringence (Δn), where $n_1 \neq n_2 \neq n_3$, of at least approximately 0.05, e.g., at least approximately 0.05, at least approximately 0.1, at least approximately 0.2, at least approximately 0.3, at least approximately 0.4, or at least approximately 0.5, including ranges between any of the foregoing values. In some embodiments, a birefringent organic crystalline phase may be characterized by a birefringence of less than approximately 0.05, e.g., less than approximately 0.05, less than approximately 0.1, less than approximately 0.05, less than approximately 0.02, less than approximately 0.01, less than approximately 0.005, less than approximately 0.002, or less than approximately 0.001, including ranges between any of the foregoing values.

Three axis ellipsometry data for example isotropic or anisotropic organic molecules are shown in Table 1. The data include predicted and measured refractive index values and birefringence values for 1,2,3-trichlorobenzene (1,2,3-TCB), 1,2-diphenylethyne (1,2-DPE), and phenazine. Shown are larger than anticipated refractive index values and birefringence compared to calculated values based on the HOMO-LUMO gap for each organic material composition.

TABLE 1

Index and Birefringence Data for Example Organic Semiconductors

| Organic Material | Predicted Index | Measured Index (589 nm) nx | ny | nz | Birefringence Δn(xy) | Δn(xz) | Δn(yz) |
|---|---|---|---|---|---|---|---|
| 1,2,3-TCB | 1.567 | 1.67 | 1.76 | 1.85 | 0.09 | 0.18 | 0.09 |
| 1,2-DPE | 1.623 | 1.62 | 1.83 | 1.63 | 0.18 | 0.01 | 0.17 |
| phenazine | 1.74 | 1.76 | 1.84 | 1.97 | 0.08 | 0.21 | 0.13 |

Organic solid thin films, including multilayer organic solid thin films, may be optically transparent and exhibit low bulk haze. As used herein, a material or element that is "transparent" or "optically transparent" may, for a given thickness, have a transmissivity within the visible light and/or near-IR spectra of at least approximately 60%, e.g., approximately 60, 65, 70, 75, 80, 90, 95, 97, 98, 99, or 99.5%, including ranges between any of the foregoing values, and less than approximately 5% bulk haze, e.g., approximately 0.1, 0.2, 0.4, 1, 2, or 4% bulk haze, including ranges between any of the foregoing values. Transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

In some embodiments, one or more organic solid thin film layers may be diced and stacked to form a multilayer. A multilayer thin film may be formed by clocking and stacking individual layers. That is, in an example "clocked" multilayer stack, an angle of refractive index misorientation between successive layers may range from approximately 1° to approximately 90°, e.g., 1, 2, 5, 10, 20, 30, 40, 45, 50, 60, 70, 80, or 90°, including ranges between any of the foregoing values.

In example multilayer architectures, the thickness of each layer may be determined from an average value of in-plane refractive indices ($n_2$ and $n_3$), where $(n_2+n_3)/2$ may be greater than approximately 1.5, e.g., greater than 1.5, greater than 1.55, or greater than 1.6. Generally, the thickness of a given layer may be inversely proportional to the arithmetic average of its in-plane indices. In a similar vein, the total number of layers in a multilayer stack may be determined from the in-plane birefringence ($|n_3-n_2|$), which may be greater than approximately 0.05, e.g., greater than 0.05, greater than 0.1, or greater than 0.2.

In a multilayer architecture, the thickness of each OSC layer may be constant or variable. In some examples, the OSC layer thickness may vary throughout the stack. The OSC layer thickness may vary continuously, for instance, with the thickness increasing for each successive layer throughout the multilayer.

According to some embodiments, for a given biaxially-oriented organic solid material layer within a multilayer stack, the out-of-plane index ($n_1$) may be related to the in-plane refractive indices ($n_2$ and $n_3$) by the relationship $$n_1 = \frac{1}{2\pi}\int_0^{2\pi} \sqrt{(n_2 \sin\varphi)^2 + (n_3 \cos\varphi)^2}\, d\varphi,$$

where φ represents a rotation angle of a refractive index vector between adjacent layers. The variation in $n_1$ may be less than ±0.7, less than 0.6, less than ±0.5, less than 0.4, less than ±0.3, or less than ±0.2.

According to some embodiments, a multilayer may include OSC material layers and secondary material layers arranged in an ABAB . . . repeating structure. The secondary material layers may include one or more of an amorphous polymer, amorphous inorganic compound, or liquid crystal.

A multilayer may additionally include paired conductive electrodes that are configured to apply a voltage or current to an OSC material layer located between the electrodes. In some embodiments, the electrodes may be arranged to apply a voltage or current to each OSC layer independently. In some embodiments, the electrodes may be arranged to apply a voltage or current to distinct layer groups within the multilayer. The refractive index or an OSC thin film may be manipulated by an applied voltage, current, or stress.

Disclosed are organic solid crystals having an actively tunable refractive index and birefringence. Methods of manufacturing such organic solid crystals may enable control of their surface roughness independent of surface features (e.g., gratings, etc.) and may include the formation of an optical element therefrom, such as a reflective polarizer.

According to various embodiments, an optical element including an organic solid crystal (OSC) may be integrated into an optical component or device, such as an OFET, OPV, OLED, etc., and may be incorporated into a structure or a device such as a waveguide, Fresnel lens (e.g., a cylindrical Fresnel lens or a spherical Fresnel lens), grating, photonic integrated circuit, birefringent compensation layer, reflective polarizer, index matching layer (LED/OLED), and the like. In certain embodiments, grating architectures may be tunable along one, two, or three dimensions. Optical elements may include a single layer or a multilayer OSC architecture.

As will be appreciated, one or more characteristics of organic solid crystals may be specifically tailored for a particular application. For many optical applications, for instance, it may be advantageous to control crystallite size, surface roughness, mechanical strength and toughness, and the orientation of crystallites and/or molecules within an organic solid crystal thin film. In a multilayer architecture, the composition, structure, and properties of each organic layer may be independently selected.

Organic solid crystals (e.g., OSC thin films) may be incorporated into passive and active optical waveguides, resonators, lasers, optical modulators, etc. Further example active optics include projectors and projection optics, ophthalmic high index lenses, eye-tracking, gradient-index optics, Pancharatnam-Berry phase (PBP) lenses, microlenses, pupil steering elements, optical computing, fiber optics, rewritable optical data storage, all-optical logic gates, multi-wavelength optical data processing, optical transistors, etc. According to further embodiments, organic solid crystals (e.g., OSC thin films) may be incorporated into passive optics, such as waveguides, reflective polarizers, refractive/diffractive lenses, and the like. Related optical elements for passive optics may include waveguides, polarization selective gratings, Fresnel lenses, microlenses, geometric lenses, PBP lenses, and multilayer thin films.

According to particular embodiments, a doped organic solid crystal may be incorporated into the emissive layer of a light-emitting diode. The organic solid crystal may operate as a charge transport medium and may be doped with any suitable emissive guest, such as a phosphor (e.g., fluorescent material or phosphorescent material) or fluorophore. Without wishing to be bound by theory, the OSC material may orient the emissive guest in a manner effective to emit light having a selective polarization. Thus, such a LED can directly emit s-polarized light or p-polarized light without the need to filter emitted light to obtain a desired polarization.

Suitable phosphors and fluorophores emit from a triplet-excited state. Example phosphors include metal complexes, such as platinum complexed porphyrin PtOEP (platinum-octaethyl-porphyrin), bis [2-(2-pyridinyl-N)phenyl-C] (acetylacetonato)iridium(III), Ir($ppy_2$)acac), and tris[2-(2-pyridinyl-kN)-5-(trifluoromethyl)phenyl-kC]iridium, Ir(p-$CF_3$-ppy$)_3$, although further compositions are contemplated. Example fluorophores include quantum dots and organic dyes such as fluorescein, rhodamine, and aminomethylcoumarin acetate (AMCA). The choice of phosphor/fluorophore may be determined by the host organic solid crystal and/or the desired absorption/emission characteristics of the emissive layer. For instance, the choice of phosphor or fluorophore may be determined by the shape, packing, and/or crystal structure of the host organic solid crystal and/or the desired color of absorption or emission within the visible spectrum.

As will be appreciated, the LED-based displays described herein may include microLEDs. Moreover, the LED-based displays may include organic LEDs (OLEDS), including micro-OLEDs. The LED-based displays may be incorporated into a variety of devices, such as wearable near-eye displays (NEDs). The disclosed methods and structures may be used to manufacture low cost, high resolution displays having a commercially-relevant form factor (e.g., having one or more lateral dimensions greater than approximately 1.6 inches).

Features from any of the above-mentioned embodiments may be used in combination with one another according to the general principles described herein. These and other embodiments, features, and advantages will be more fully understood upon reading the following detailed description in conjunction with the accompanying drawings and claims.

The following will provide, with reference to FIGS. 1-9, a detailed description of OLED devices and systems, and their methods of manufacture. In accordance with particular embodiments, the light extraction efficiency and quantum efficiency of the disclosed devices and systems may be improved through the co-integration of a doped organic solid crystal (OSC)-containing emissive layer. The discussion associated with FIGS. 1-3 relates to an example near-eye display (NED). The discussion associated with FIGS. 4-7 includes a description of OLEDs and OLED packaging and the incorporation of a doped OSC emissive layer in accordance with various embodiments. The discussion associated with FIGS. 8 and 9 relates to various virtual reality platforms that may include a display device as described herein.

FIG. 1 is a diagram of a near-eye-display (NED) 100, in accordance with some embodiments. The NED 100 may present media to a user. Examples of media that may be presented by the NED 100 include one or more images, video, audio, or some combination thereof. In some embodiments, audio may be presented via an external device (e.g., speakers and/or headphones) that receives audio information from the NED 100, a console (not shown), or both, and presents audio data to the user based on the audio information. The NED 100 is generally configured to operate as a virtual reality (VR) NED. However, in some embodiments, the NED 100 may be modified to also operate as an augmented reality (AR) NED, a mixed reality (MR) NED, or some combination thereof. For example, in some embodiments, the NED 100 may augment views of a physical, real-world environment with computer-generated elements (e.g., still images, video, sound, etc.).

The NED 100 shown in FIG. 1 may include a frame 105 and a display 110. The frame 105 may include one or more optical elements that together display media to a user. That is, the display 110 may be configured for a user to view the content presented by the NED 100. As discussed below in conjunction with FIG. 2, the display 110 may include at least one source assembly to generate image light to present optical media to an eye of the user. The source assembly may include, e.g., a source, an optics system, or some combination thereof.

It will be appreciated that FIG. 1 is merely an example of a virtual reality system, and the display systems described herein may be incorporated into further such systems. In some embodiments, FIG. 1 may also be referred to as a Head-Mounted-Display (HMD).

Figure 2:
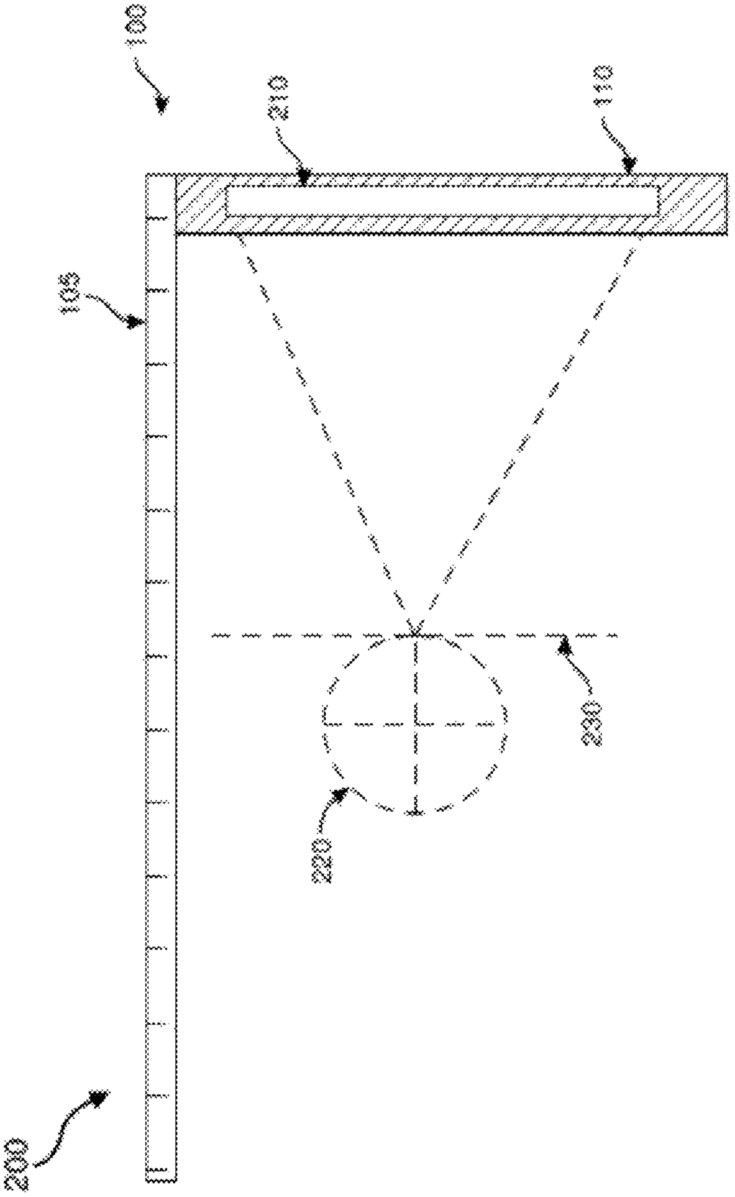
FIG. 2 is a cross-sectional view of the HMD illustrated in FIG. 1 according to some embodiments.

FIG. 2 is a cross section 200 of the NED 100 illustrated in FIG. 1, in accordance with some embodiments of the present disclosure. The cross section 200 may include at least one display assembly 210, and an exit pupil 230. The exit pupil 230 is a location where the eye 220 may be positioned when the user wears the NED 100. In some embodiments, the frame 105 may represent a frame of eye-wear glasses. For purposes of illustration, FIG. 2 shows the cross section 200 associated with a single eye 220 and a single display assembly 210, but in alternative embodiments not shown, another display assembly that is separate from or integrated with the display assembly 210 shown in FIG. 2, may provide image light to another eye of the user.

The display assembly 210 may be configured to direct the image light to the eye 220 through the exit pupil 230. The display assembly 210 may be composed of one or more materials (e.g., plastic, glass, etc.) with one or more refractive indices that effectively decrease the weight and widen a field of view of the NED 100.

In alternate configurations, the NED 100 may include one or more optical elements (not shown) between the display assembly 210 and the eye 220. The optical elements may act to, by way of various examples, correct aberrations in image light emitted from the display assembly 210, magnify image light emitted from the display assembly 210, perform some other optical adjustment of image light emitted from the display assembly 210, or combinations thereof. Example optical elements may include an aperture, a Fresnel lens, a convex lens, a concave lens, a filter, or any other suitable optical element that may affect image light.

In some embodiments, the display assembly 210 may include a source assembly to generate image light to present media to a user's eyes. The source assembly may include, e.g., a light source, an optics system, or some combination thereof. In accordance with various embodiments, a source assembly may include a light-emitting diode (LED) such as an organic light-emitting diode (OLED).

Figure 3:
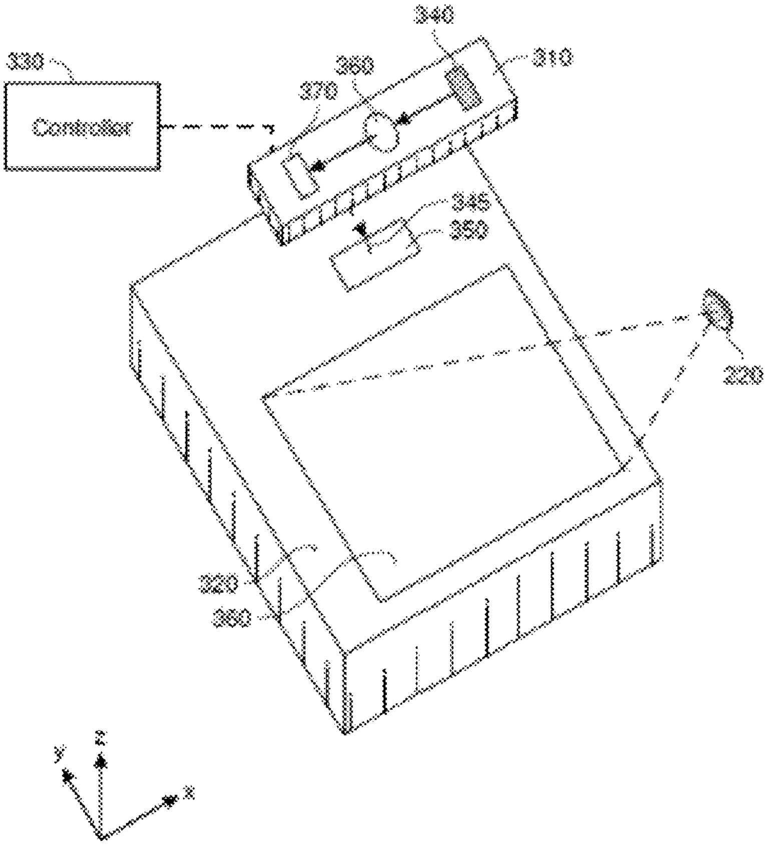
FIG. 3 illustrates an isometric view of a waveguide display in accordance with various embodiments.

FIG. 3 illustrates an isometric view of a waveguide display 300 in accordance with some embodiments. The waveguide display 300 may be a component (e.g., display assembly 210) of NED 100. In alternate embodiments, the waveguide display 300 may constitute a part of some other NED, or other system that directs display image light to a particular location.

The waveguide display 300 may include a source assembly 310, an output waveguide 320, and a controller 330. For purposes of illustration, FIG. 3 shows the waveguide display 300 associated with a single eye 220, but in some embodiments, another waveguide display separate (or partially separate) from the waveguide display 300 may provide image light to another eye of the user. In a partially separate system, for instance, one or more components may be shared between waveguide displays for each eye.

The source assembly 310 generates image light. The source assembly 310 may include a source 340, a light conditioning assembly 360, and a scanning mirror assembly 370. The source assembly 310 may generate and output image light 345 to a coupling element 350 of the output waveguide 320.

The source 340 may include a source of light that generates at least a coherent or partially coherent image light 345. The source 340 may emit light in accordance with one or more illumination parameters received from the controller 330. The source 340 may include one or more source elements, including, but not restricted to light-emitting diodes, such as micro-OLEDs, as described in detail below with reference to FIGS. 4-10.

The output waveguide 320 may be configured as an optical waveguide that outputs image light to an eye 220 of a user. The output waveguide 320 receives the image light 345 through one or more coupling elements 350 and guides the received input image light 345 to one or more decoupling elements 360. In some embodiments, the coupling element 350 couples the image light 345 from the source assembly 310 into the output waveguide 320. The coupling element 350 may be or include a diffraction grating, a holographic grating, some other element that couples the image light 345 into the output waveguide 320, or some combination thereof. For example, in embodiments where the coupling element 350 is a diffraction grating, the pitch of the diffraction grating may be chosen such that total internal reflection occurs, and the image light 345 propagates internally toward the decoupling element 360. For example, the pitch of the diffraction grating may be in the range of approximately 300 nm to approximately 600 nm.

The decoupling element 360 decouples the total internally reflected image light from the output waveguide 320. The decoupling element 360 may be or include a diffraction grating, a holographic grating, some other element that decouples image light out of the output waveguide 320, or some combination thereof. For example, in embodiments where the decoupling element 360 is a diffraction grating, the pitch of the diffraction grating may be chosen to cause incident image light to exit the output waveguide 320. An orientation and position of the image light exiting from the output waveguide 320 may be controlled by changing an orientation and position of the image light 345 entering the coupling element 350.

The output waveguide 320 may be composed of one or more materials that facilitate total internal reflection of the image light 345. The output waveguide 320 may be composed of, for example, silicon, glass, or a polymer, or some combination thereof. The output waveguide 320 may have a relatively small form factor such as for use in a head-mounted display. For example, the output waveguide 320 may be approximately 30 mm wide along an x-dimension, 50 mm long along a y-dimension, and 0.5-1 mm thick along a z-dimension. In some embodiments, the output waveguide 320 may be a planar (2D) optical waveguide.

The controller 330 may be used to control the scanning operations of the source assembly 310. In certain embodiments, the controller 330 may determine scanning instructions for the source assembly 310 based at least on one or more display instructions. Display instructions may include instructions to render one or more images. In some embodiments, display instructions may include an image file (e.g., bitmap). The display instructions may be received from, e.g., a console of a virtual reality system (not shown). Scanning instructions may include instructions used by the source assembly 310 to generate image light 345. The scanning instructions may include, e.g., a type of a source of image light (e.g. monochromatic, polychromatic), a scanning rate, an orientation of scanning mirror assembly 370, and/or one or more illumination parameters, etc. The controller 330 may include a combination of hardware, software, and/or firmware not shown here so as not to obscure other aspects of the disclosure.

According to some embodiments, source 340 may include a light-emitting diode (LED), such as an organic light-emitting diode (OLED). An organic light-emitting diode (OLED) is a light-emitting diode (LED) having an emissive electroluminescent layer that may include a thin film of an organic compound that emits light in response to an electric current. The organic layer is typically situated between a pair of conductive electrodes. One or both of the electrodes may be transparent.

As will be appreciated, an OLED display can be driven with a passive-matrix (PMOLED) or active-matrix (AMOLED) control scheme. In a PMOLED scheme, each row (and line) in the display may be controlled sequentially, whereas AMOLED control typically uses a thin-film transistor backplane to directly access and switch each individual pixel on or off, which allows for higher resolution and larger display areas.

Figure 4:
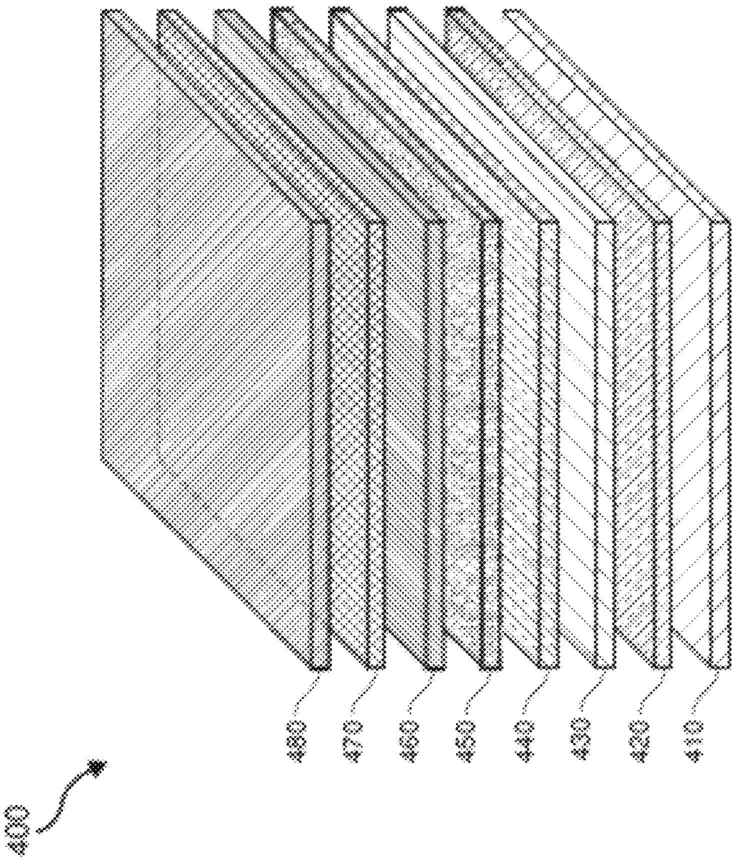
FIG. 4 depicts an exploded perspective view of a simplified OLED structure according to some embodiments.

A simplified structure of an OLED according to some embodiments is depicted in FIG. 4. As shown in an exploded view, OLED 400 may include, from bottom to top, a substrate 410, anode 420, hole injection layer 430, hole transport layer 440, emissive layer 450, blocking layer 460, electron transport layer 470, and cathode 480. In some embodiments, substrate (or backplane) 410 may include single crystal or polycrystalline silicon or other suitable semiconductor (e.g., germanium).

Anode 420 and cathode 480 may include any suitable conductive material(s), such as transparent conductive oxides (TCOs, e.g., indium tin oxide (ITO), zinc oxide (ZnO), and the like). The anode 420 and cathode 480 are configured to inject holes and electrons, respectively, into one or more organic layer(s) within emissive layer 450 during operation of the device.

The hole injection layer 430, which is disposed over the anode 420, receives holes from the anode 420 and is configured to inject the holes deeper into the device, while the adjacent hole transport layer 440 may support the transport of holes to the emissive layer 450. The emissive layer 450 converts electrical energy to light. Emissive layer 450 may include one or more organic molecules, or light-emitting fluorescent dyes or dopants, which may be dispersed in a suitable matrix as known to those skilled in the art.

Blocking layer 460 may improve device function by confining electrons (charge carriers) to the emissive layer 450. Electron transport layer 470 may support the transport of electrons from the cathode 480 to the emissive layer 450.

In some embodiments, the generation of red, green, and blue light (to render full-color images) may include the formation of red, green, and blue OLED sub-pixels in each pixel of the display. Alternatively, the OLED 400 may be adapted to produce white light in each pixel. The white light may be passed through a color filter to produce red, green, and blue sub-pixels.

Any suitable deposition process(es) may be used to form OLED 400. For example, one or more of the layers constituting the OLED may be fabricated using physical vapor deposition (PVD), chemical vapor deposition (CVD), evaporation, spray-coating, spin-coating, atomic layer deposition (ALD), and the like. In further aspects, OLED 400 may be manufactured using a thermal evaporator, a sputtering system, 3D printing, stamping, etc.

According to some embodiments, OLED 400 may be a micro-OLED. A "micro-OLED," in accordance with various examples, may refer to a particular type of OLED having a small active light emitting area (e.g., less than 2,000 $\mu m^2$ in some embodiments, less than 20 $\mu m^2$ or less than 10 $\mu m^2$ in other embodiments). In some embodiments, the emissive surface of the micro-OLED may have a diameter of less than approximately 2 μm. Such a micro-OLED may also have collimated light output, which may increase the brightness level of light emitted from the small active light emitting area.

Figure 5:
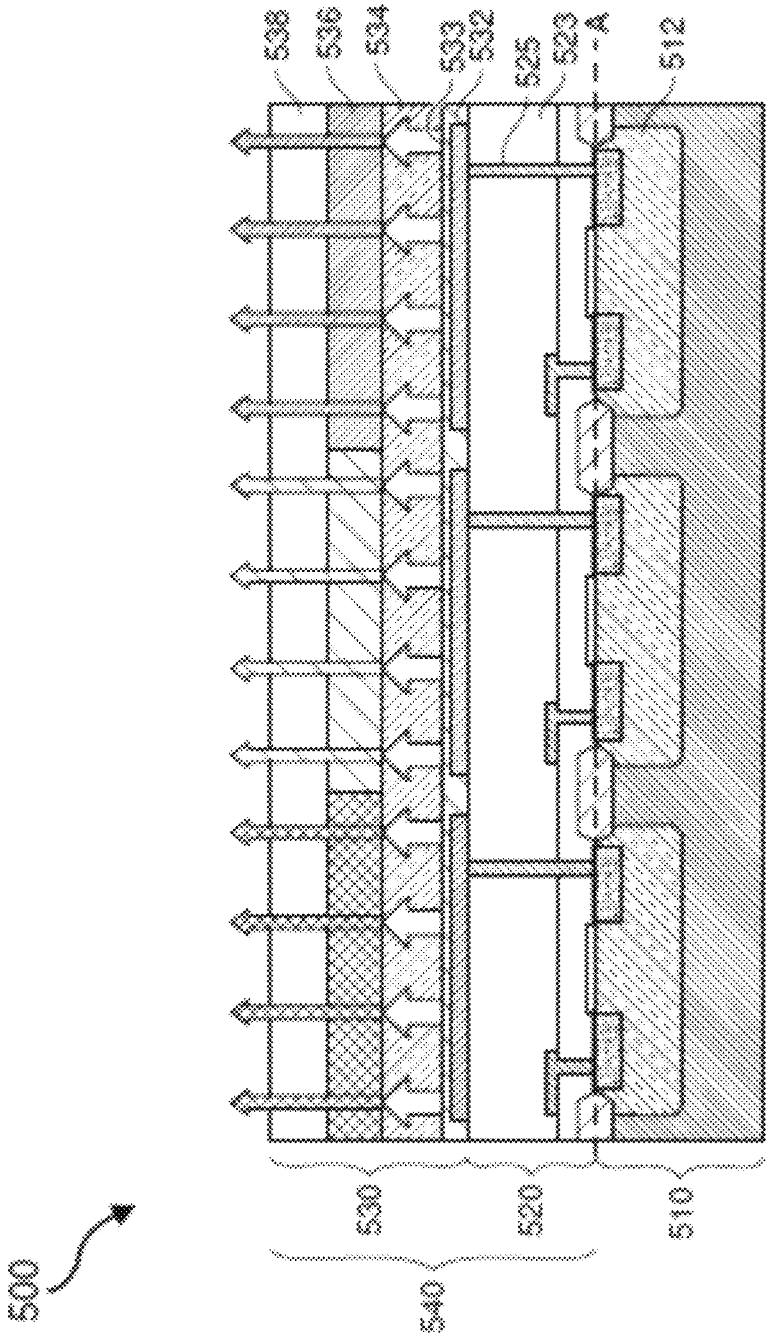
FIG. 5 is a schematic view of an OLED display architecture including a display driver integrated circuit (DDIC) mounted over a back face of a silicon backplane according to some embodiments.

An example OLED device is shown schematically in FIG. 5. According to some embodiments, OLED device 500 (e.g., micro-OLED chip) may include a display active area 530 having an active matrix 532 (such as OLED 400) disposed over a single crystal (e.g., silicon) backplane 520. The combined display/backplane architecture, i.e., display element 540 may be bonded (e.g., at or about interface A) directly or indirectly to a display driver integrated circuit (DDIC) 510. As illustrated, DDIC 510 may include an array of driving transistors 512, which may be formed using conventional CMOS processing as will be appreciated by those skilled in the art. One or more display driver integrated circuits may be formed over a single crystal (e.g., silicon) substrate.

In some embodiments, the display active area 530 may have at least one areal dimension (i.e., length or width) greater than approximately 1.3 inches, e.g., approximately 1.4, 1.5, 1.6, 1.7, 1.8, 1.9, 2.0, 2.25, 2.5, 2.75, or 3 inches, including ranges between any of the foregoing values, although larger area displays are contemplated.

Silicon backplane 520 may include a single crystal or polycrystalline silicon layer 523 having a through silicon via 525 for electrically connecting the DDIC 510 with the display active area 530. In some embodiments, display active area 530 may further include a transparent capping layer 534 disposed over an upper emissive surface 533 of active matrix 532, a color filter 536, and cover glass 538. Active matrix 532, including emissive surface 533, may include a doped organic solid crystal.

According to various embodiments, the display active area 530 and underlying silicon backplane 520 may be manufactured separately from, and then later bonded to, DDIC 510, which may simplify formation of the OLED active area, including formation of the active matrix 532, color filter 536, etc.

The DDIC 510 may be directly bonded to a back face of the silicon backplane opposite to active matrix 532. In further embodiments, a chip-on-flex (COF) packaging technology may be used to integrate display element 540 with DDIC 510, optionally via a data selector (i.e., multiplexer) array (not shown) to form OLED device 500. As used herein, the terms "multiplexer" or "data selector" may, in some examples, refer to a device adapted to combine or select from among plural analog or digital input signals, which are transmitted to a single output. Multiplexers may be used to increase the amount of data that can be communicated within a certain amount of space, time, and bandwidth.

Figure 6:
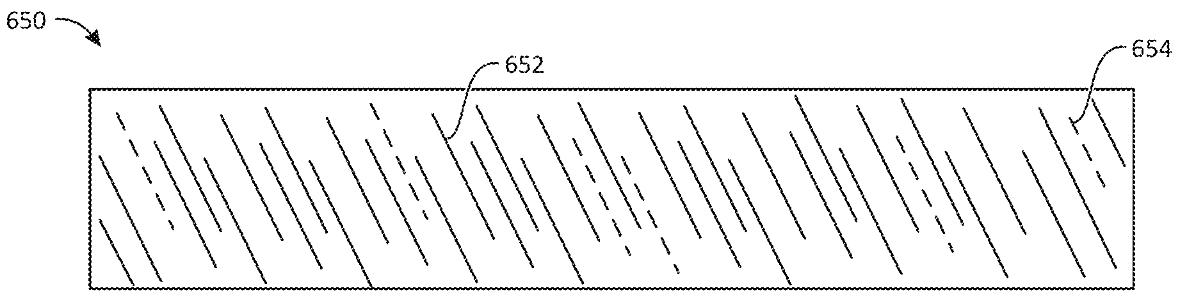
FIG. 6 is a cross-sectional view of a doped organic solid crystal emissive layer according to particular embodiments.

Referring to FIG. 6, shown is a simplified cross-sectional view of an OSC-containing emissive layer 650. Emissive layer 650 may include an organic solid crystal matrix 652 and a dopant 654 distributed throughout the matrix. The dopant 654 may be aligned within the matrix 652 in an manner effective to produce light emission having a selective polarization.

Figure 7:
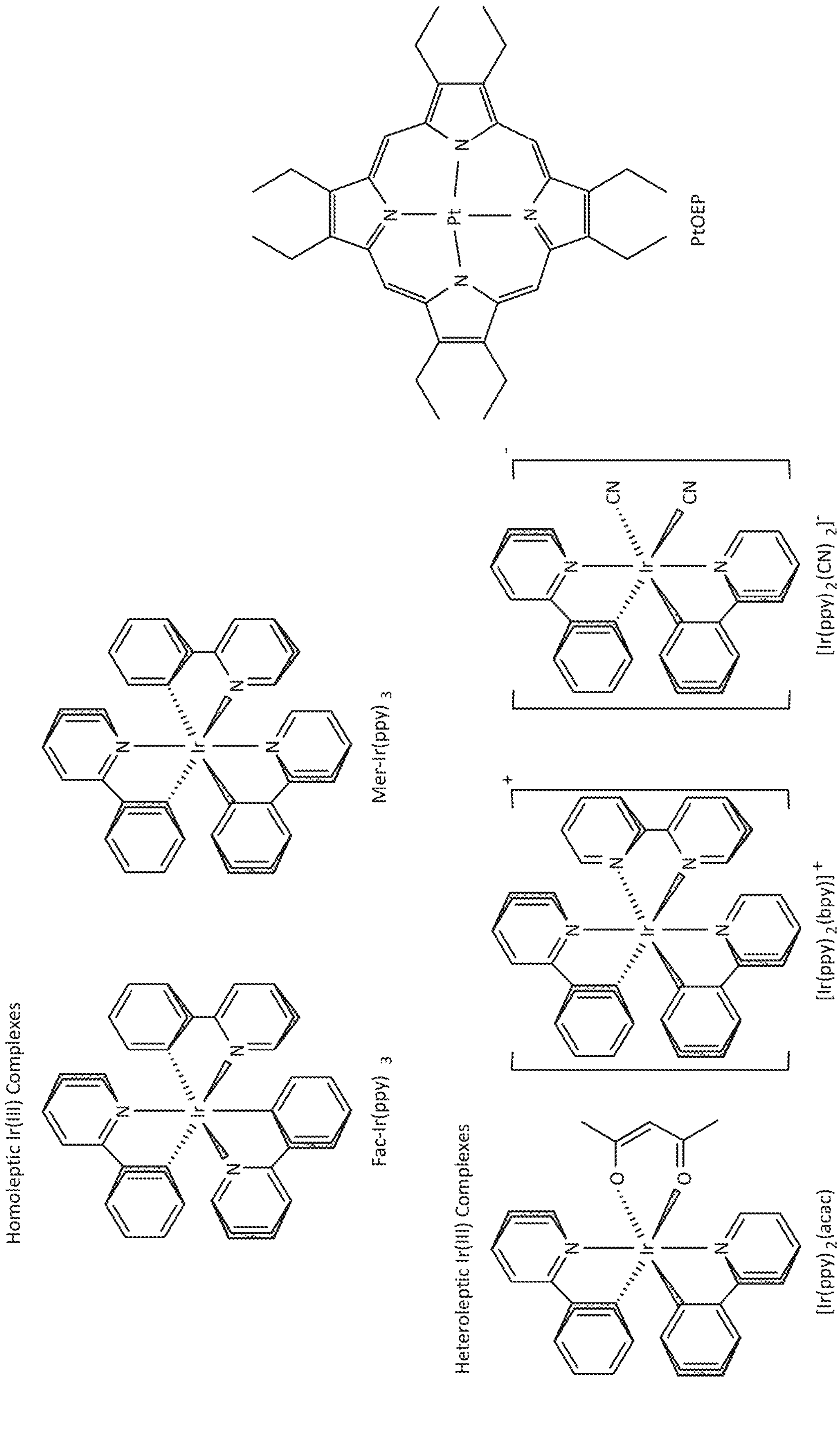
FIG. 7 is an illustration of example dopants suitable for forming a doped organic solid emissive layer according to certain embodiments.

Referring to FIG. 7, shown are example phosphors. In such materials, phosphorescence may arise from the emission of light from triplet-excited states, in which an electron in an excited orbital has the same spin orientation as n ground-state electron.

Disclosed are light-emitting diodes (LEDs) having an emissive layer formed from a doped organic crystal. Example dopants include light-emitting phosphors or fluorophores, which may be configured to emit light with a selected polarization. In particular embodiments, the phosphor may be oriented by the organic crystal in a manner effective to produce selective polarization (e.g., p or s) at a working wavelength. Example organic crystal materials include small molecules, macromolecules, liquid crystals, organometallic compounds, oligomers, and polymers, and may include organic semiconductors such as polycyclic aromatic compounds, e.g., anthracene, phenanthrene, and the like.

Methods of manufacturing organic crystals may include crystal growth from a melt or solution, and chemical or physical vapor deposition using a suitable precursor. Doping can be performed in situ where the type and amount of dopant may be selected to impact the crystal structure and optical properties of the organic crystal material. Example dopants include metal complexes such as platinum complexed porphyrin PtOEP (platinum-octaethyl-porphyrin).

EXAMPLE EMBODIMENTS

Example 1: A device includes a light-emitting diode having an emissive surface, where the emissive surface includes a doped organic solid crystal.

Example 2: The device of Example 1, where the light-emitting diode is an OLED.

Example 3: The device of any of Examples 1 and 2, where the emissive layer is disposed between an anode and a cathode.

Example 4: The device of any of Examples 1-3, where the organic solid crystal includes a single crystal.

Example 5: The device of any of Examples 1-4, where the organic solid crystal includes a hydrocarbon compound selected from anthracene, tetracene, phenanthrene, tolane, pyrene, corannulene, fluorene, biphenyl, and ter-phenyl.

Example 6: The device of any of Examples 1-5, where the organic solid crystal includes a saturated or unsaturated heterocycle or polycyclic aromatic hydrocarbon selected from furan, pyrrole, thiophene, pyridine, pyrimidine, piperidine, quinolines, benzothiophenes, benzopyrans, bent and asymmetric acenes, 2,6-naphthalene dicarboxylic acid, and 2,6-dimethyl carboxylic esters.

Example 7: The device of any of Examples 1-6, where the organic solid crystal includes a functional group selected from an amine, an alcohol, and a carboxylic acid.

Example 8: The device of any of Examples 1-7, where the organic solid crystal includes a dopant selected from platinum-octaethyl-porphyrin, bis [2-(2-pyridinyl-N)phenyl-C](acetylacetonato)iridium(III), Ir($ppy_2$)acac), tris[2-(2-pyridinyl-kN)-5-(trifluoromethyl)phenyl-kC]iridium, Ir(p-$CF_3$-ppy)$_3$, fluorescein, rhodamine, and aminomethylcoumarin acetate.

Example 9: The device of any of Examples 1-8, where a concentration of dopant within the organic solid crystal ranges from approximately 0.01 wt. % to approximately 50 wt. %.

Example 10: The device of any of Examples 1-9, where the dopant is configured to influence an optical property of the light-emitting diode.

Example 11: The device of any of Examples 1-10, where the dopant is aligned within the organic solid crystal in an manner effective to produce light emission having a selective polarization.

Example 12: A light-emitting diode includes an anode, a hole injection layer overlying the anode, a hole transport layer overlying the hole injection layer, an emissive layer overlying the hole transport layer, a blocking layer overlying the emissive layer, an electron transport layer overlying the blocking layer, and a cathode overlying the electron transport layer, where the emissive layer includes a doped organic solid crystal.

Example 13: The light-emitting diode of Example 12, where the organic solid crystal includes a single crystal.

Example 14: The light-emitting diode of any of Examples 12 and 13, where the organic solid crystal includes a hydrocarbon compound selected from anthracene, tetracene, phenanthrene, tolane, pyrene, corannulene, fluorene, biphenyl, and ter-phenyl.

Example 15: The light-emitting diode of any of Examples 12-14, where the organic solid crystal includes a hydrocarbon selected from furan, pyrrole, thiophene, pyridine, pyrimidine, piperidine, quinolines, benzothiophenes, benzopyrans, bent and asymmetric acenes, 2,6-naphthalene dicarboxylic acid, and 2,6-dimethyl carboxylic esters.

Example 16: The light-emitting diode of any of Examples 12-15, where the organic solid crystal includes a functional group selected from an amine, alcohol, and carboxylic acid.

Example 17: The light-emitting diode of any of Examples 12-16, where the organic solid crystal includes a dopant selected from platinum-octaethyl-porphyrin, bis [2-(2-pyridinyl-N)phenyl-C](acetylacetonato)iridium(III), Ir($ppy_2$)acac), tris[2-(2-pyridinyl-kN)-5-(trifluoromethyl)phenyl-kC]iridium, Ir(p-$CF_3$-ppy)$_3$, fluorescein, rhodamine, and aminomethylcoumarin acetate.

Example 18: A method includes forming a primary electrode, forming an organic solid crystal layer including an emissive dopant over the primary electrode, and forming a secondary electrode over the organic solid crystal layer and at least partially overlapping the primary electrode.

Example 19: The method of Example 18, where the organic solid crystal layer includes a single crystal.

Example 20: The method of any of Examples 18 and 19, where the emissive dopant includes a phosphor or a fluorophore.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 800 in FIG. 8) or that visually immerses a user in an artificial reality (such as, e.g., virtual-reality system 900 in FIG. 9). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 8:
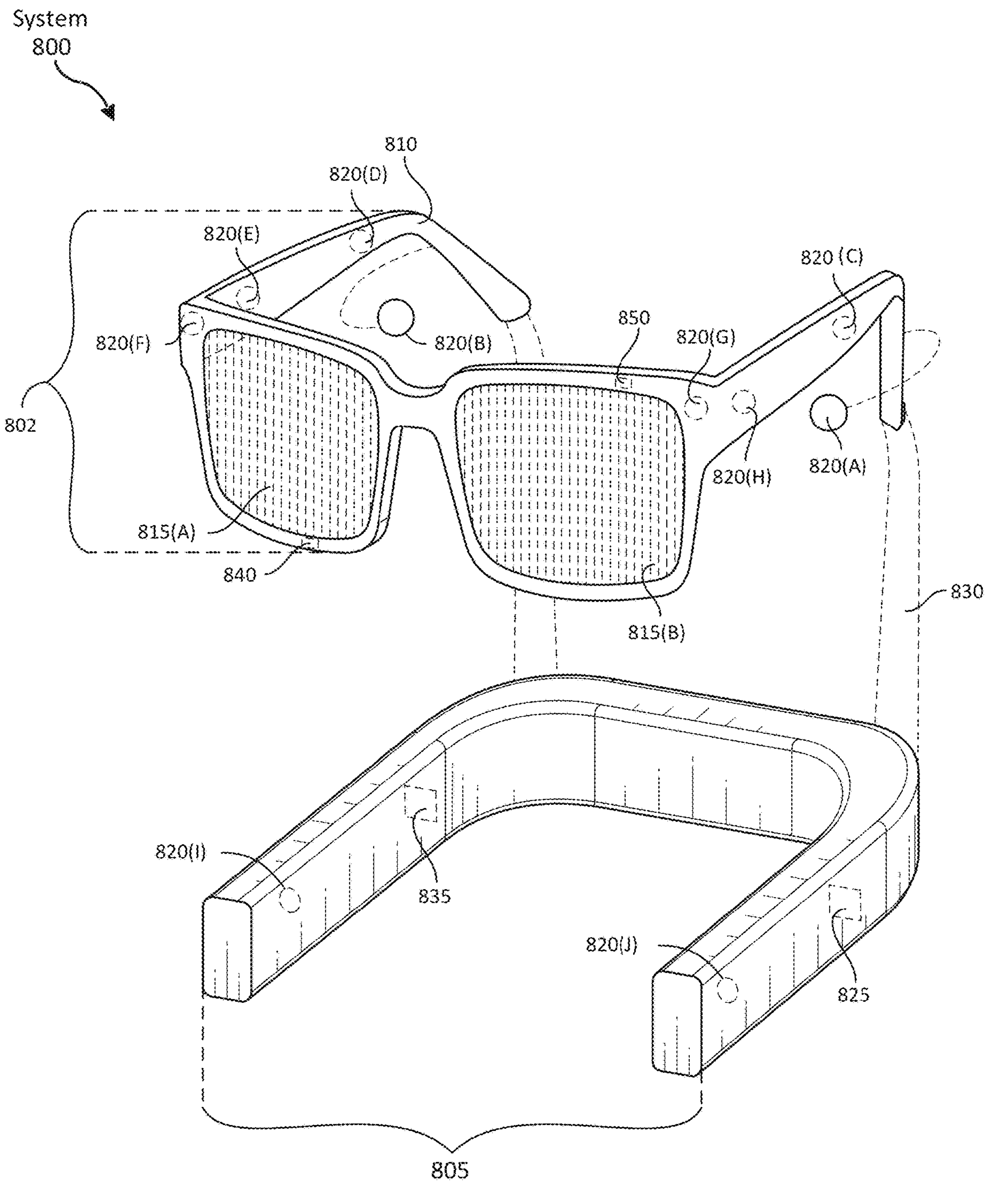
FIG. 8 is an illustration of exemplary augmented-reality glasses that may be used in connection with embodiments of this disclosure.
Figure 9:
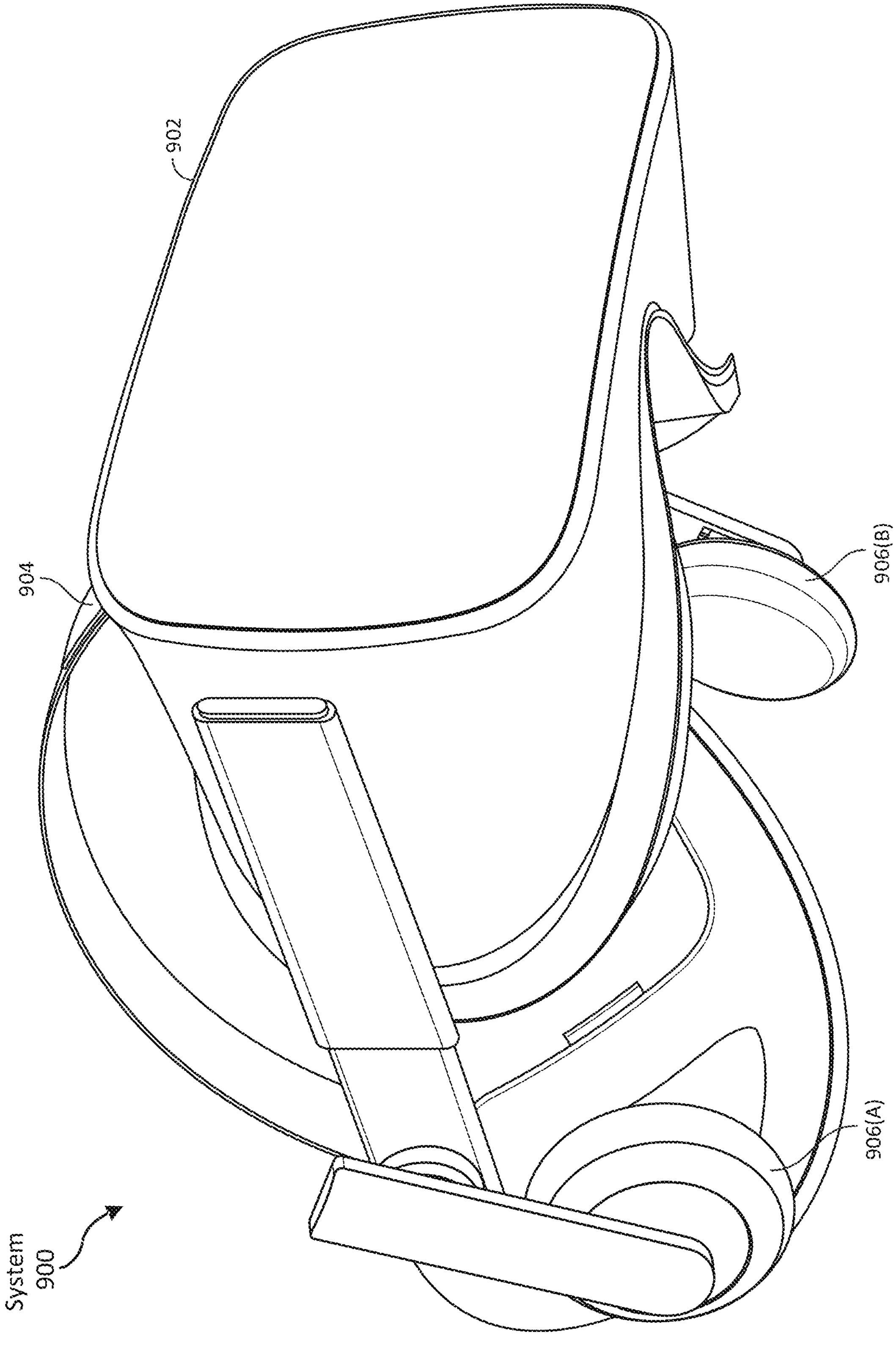
FIG. 9 is an illustration of an exemplary virtual-reality headset that may be used in connection with embodiments of this disclosure.

Turning to FIG. 8, augmented-reality system 800 may include an eyewear device 802 with a frame 810 configured to hold a left display device 815(A) and a right display device 815(B) in front of a user's eyes. Display devices 815(A) and 815(B) may act together or independently to present an image or series of images to a user. While augmented-reality system 800 includes two displays, embodiments of this disclosure may be implemented in augmented-reality systems with a single NED or more than two NEDs.

In some embodiments, augmented-reality system 800 may include one or more sensors, such as sensor 840. Sensor 840 may generate measurement signals in response to motion of augmented-reality system 800 and may be located on substantially any portion of frame 810. Sensor 840 may represent one or more of a variety of different sensing mechanisms, such as a position sensor, an inertial measurement unit (IMU), a depth camera assembly, a structured light emitter and/or detector, or any combination thereof. In some embodiments, augmented-reality system 800 may or may not include sensor 840 or may include more than one sensor. In embodiments in which sensor 840 includes an IMU, the IMU may generate calibration data based on measurement signals from sensor 840. Examples of sensor 840 may include, without limitation, accelerometers, gyroscopes, magnetometers, other suitable types of sensors that detect motion, sensors used for error correction of the IMU, or some combination thereof.

In some examples, augmented-reality system 800 may also include a microphone array with a plurality of acoustic transducers 820(A)-820(J), referred to collectively as acoustic transducers 820. Acoustic transducers 820 may represent transducers that detect air pressure variations induced by sound waves. Each acoustic transducer 820 may be configured to detect sound and convert the detected sound into an electronic format (e.g., an analog or digital format). The microphone array in FIG. 8 may include, for example, ten acoustic transducers: 820(A) and 820(B), which may be designed to be placed inside a corresponding ear of the user, acoustic transducers 820(C), 820(D), 820(E), 820(F), 820

(G), and 820(H), which may be positioned at various locations on frame 810, and/or acoustic transducers 820(I) and 820(J), which may be positioned on a corresponding neckband 805.

In some embodiments, one or more of acoustic transducers 820(A)-(J) may be used as output transducers (e.g., speakers). For example, acoustic transducers 820(A) and/or 820(B) may be earbuds or any other suitable type of headphone or speaker.

The configuration of acoustic transducers 820 of the microphone array may vary. While augmented-reality system 800 is shown in FIG. 8 as having ten acoustic transducers 820, the number of acoustic transducers 820 may be greater or less than ten. In some embodiments, using higher numbers of acoustic transducers 820 may increase the amount of audio information collected and/or the sensitivity and accuracy of the audio information. In contrast, using a lower number of acoustic transducers 820 may decrease the computing power required by an associated controller 850 to process the collected audio information. In addition, the position of each acoustic transducer 820 of the microphone array may vary. For example, the position of an acoustic transducer 820 may include a defined position on the user, a defined coordinate on frame 810, an orientation associated with each acoustic transducer 820, or some combination thereof.

Acoustic transducers 820(A) and 820(B) may be positioned on different parts of the user's ear, such as behind the pinna, behind the tragus, and/or within the auricle or fossa. Or, there may be additional acoustic transducers 820 on or surrounding the ear in addition to acoustic transducers 820 inside the ear canal. Having an acoustic transducer 820 positioned next to an ear canal of a user may enable the microphone array to collect information on how sounds arrive at the ear canal. By positioning at least two of acoustic transducers 820 on either side of a user's head (e.g., as binaural microphones), augmented-reality device 800 may simulate binaural hearing and capture a 3D stereo sound field around about a user's head. In some embodiments, acoustic transducers 820(A) and 820(B) may be connected to augmented-reality system 800 via a wired connection 830, and in other embodiments acoustic transducers 820(A) and 820(B) may be connected to augmented-reality system 800 via a wireless connection (e.g., a BLUETOOTH connection). In still other embodiments, acoustic transducers 820(A) and 820(B) may not be used at all in conjunction with augmented-reality system 800.

Acoustic transducers 820 on frame 810 may be positioned in a variety of different ways, including along the length of the temples, across the bridge, above or below display devices 815(A) and 815(B), or some combination thereof. Acoustic transducers 820 may also be oriented such that the microphone array is able to detect sounds in a wide range of directions surrounding the user wearing the augmented-reality system 800. In some embodiments, an optimization process may be performed during manufacturing of augmented-reality system 800 to determine relative positioning of each acoustic transducer 820 in the microphone array.

In some examples, augmented-reality system 800 may include or be connected to an external device (e.g., a paired device), such as neckband 805. Neckband 805 generally represents any type or form of paired device. Thus, the following discussion of neckband 805 may also apply to various other paired devices, such as charging cases, smart watches, smart phones, wrist bands, other wearable devices, hand-held controllers, tablet computers, laptop computers, other external compute devices, etc.

As shown, neckband 805 may be coupled to eyewear device 802 via one or more connectors. The connectors may be wired or wireless and may include electrical and/or non-electrical (e.g., structural) components. In some cases, eyewear device 802 and neckband 805 may operate independently without any wired or wireless connection between them. While FIG. 8 illustrates the components of eyewear device 802 and neckband 805 in example locations on eyewear device 802 and neckband 805, the components may be located elsewhere and/or distributed differently on eyewear device 802 and/or neckband 805. In some embodiments, the components of eyewear device 802 and neckband 805 may be located on one or more additional peripheral devices paired with eyewear device 802, neckband 805, or some combination thereof.

Pairing external devices, such as neckband 805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 800 may be provided by a paired device or shared between a paired device and an eyewear device, thus reducing the weight, heat profile, and form factor of the eyewear device overall while still retaining desired functionality. For example, neckband 805 may allow components that would otherwise be included on an eyewear device to be included in neckband 805 since users may tolerate a heavier weight load on their shoulders than they would tolerate on their heads. Neckband 805 may also have a larger surface area over which to diffuse and disperse heat to the ambient environment. Thus, neckband 805 may allow for greater battery and computation capacity than might otherwise have been possible on a stand-alone eyewear device. Since weight carried in neckband 805 may be less invasive to a user than weight carried in eyewear device 802, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 805 may be communicatively coupled with eyewear device 802 and/or to other devices. These other devices may provide certain functions (e.g., tracking, localizing, depth mapping, processing, storage, etc.) to augmented-reality system 800. In the embodiment of FIG. 8, neckband 805 may include two acoustic transducers (e.g., 820(I) and 820(J)) that are part of the microphone array (or potentially form their own microphone subarray). Neckband 805 may also include a controller 825 and a power source 835.

Acoustic transducers 820(I) and 820(J) of neckband 805 may be configured to detect sound and convert the detected sound into an electronic format (analog or digital). In the embodiment of FIG. 8, acoustic transducers 820(I) and 820(J) may be positioned on neckband 805, thereby increasing the distance between the neckband acoustic transducers 820(I) and 820(J) and other acoustic transducers 820 positioned on eyewear device 802. In some cases, increasing the distance between acoustic transducers 820 of the microphone array may improve the accuracy of beamforming performed via the microphone array. For example, if a sound is detected by acoustic transducers 820(C) and 820(D) and the distance between acoustic transducers 820(C) and 820(D) is greater than, e.g., the distance between acoustic transducers 820(D) and 820(E), the determined source location of the detected sound may be more accurate than if the sound had been detected by acoustic transducers 820(D) and 820(E).

Controller 825 of neckband 805 may process information generated by the sensors on neckband 805 and/or augmented-reality system 800. For example, controller 825 may process information from the microphone array that describes sounds detected by the microphone array. For each detected sound, controller 825 may perform a direction-of-arrival (DOA) estimation to estimate a direction from which the detected sound arrived at the microphone array. As the microphone array detects sounds, controller 825 may populate an audio data set with the information. In embodiments in which augmented-reality system 800 includes an inertial measurement unit, controller 825 may compute all inertial and spatial calculations from the IMU located on eyewear device 802. A connector may convey information between augmented-reality system 800 and neckband 805 and between augmented-reality system 800 and controller 825. The information may be in the form of optical data, electrical data, wireless data, or any other transmittable data form. Moving the processing of information generated by augmented-reality system 800 to neckband 805 may reduce weight and heat in eyewear device 802, making it more comfortable to the user.

Power source 835 in neckband 805 may provide power to eyewear device 802 and/or to neckband 805. Power source 835 may include, without limitation, lithium ion batteries, lithium-polymer batteries, primary lithium batteries, alkaline batteries, or any other form of power storage. In some cases, power source 835 may be a wired power source. Including power source 835 on neckband 805 instead of on eyewear device 802 may help better distribute the weight and heat generated by power source 835.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 900 in FIG. 9, that mostly or completely covers a user's field of view. Virtual-reality system 900 may include a front rigid body 902 and a band 904 shaped to fit around a user's head. Virtual-reality system 900 may also include output audio transducers 906(A) and 906(B). Furthermore, while not shown in FIG. 9, front rigid body 902 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 800 and/or virtual-reality system 900 may include one or more liquid crystal displays (LCDs), light-emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 800 and/or virtual-reality system 900 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 800 and/or virtual-reality system 900 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting of" or "consisting essentially of," are implied. Thus, for example, implied alternative embodiments to an OSC layer that comprises or includes anthracene include embodiments where an OSC layer consists essentially of anthracene and embodiments where an OSC layer consists of anthracene.

What is claimed is:

1. A device comprising a light-emitting diode having an emissive layer wherein the emissive layer comprises a doped organic solid crystal, wherein the dopant is aligned within the organic solid crystal in a manner effective to produce light emission having a selective polarization.

2. The device of claim 1, wherein the light-emitting diode is an OLED.

3. The device of claim 1, wherein the emissive layer is disposed between an anode and a cathode.

4. The device of claim 1, wherein the organic solid crystal comprises a single crystal.

5. The device of claim 1, wherein the organic solid crystal comprises a hydrocarbon compound selected from the group consisting of anthracene, tetracene, phenanthrene, tolane, pyrene, corannulene, fluorene, biphenyl, and ter-phenyl.

6. The device of claim 1, wherein the organic solid crystal comprises a hydrocarbon selected from the group consisting of furan, pyrrole, thiophene, pyridine, pyrimidine, piperidine, quinolines, benzothiophenes, benzopyrans, bent and asymmetric acenes, 2,6-naphthalene dicarboxylic acid, and 2,6-dimethyl carboxylic esters.

7. The device of claim 1, wherein the organic solid crystal comprises a functional group selected from the group consisting of an amine, alcohol, and carboxylic acid.

8. The device of claim 1, wherein the organic solid crystal comprises a dopant selected from the group consisting of platinum-octaethyl-porphyrin, bis [2-(2-pyridinyl-N)phenyl-C](acetylacetonato)iridium(III), Ir(ppy$_2$)acac), tris[2-(2-pyridinyl-kN)-5-(trifluoromethyl)phenyl-kC]iridium, Ir(p-CF$_3$-ppy)$_3$, fluorescein, rhodamine, and aminomethylcoumarin acetate.

9. The device of claim 1, wherein a concentration of dopant within the organic solid crystal ranges from approximately 0.01 wt. % to approximately 50 wt. %.

10. The device of claim 1, wherein the dopant is configured to influence an optical property of the light-emitting diode.

11. A light-emitting diode comprising:

an anode;

a hole injection layer overlying the anode;

a hole transport layer overlying the hole injection layer;

an emissive layer overlying the hole transport layer;

a blocking layer overlying the emissive layer;

an electron transport layer overlying the blocking layer; and a cathode overlying the electron transport layer, wherein the emissive layer comprises a doped organic solid crystal, wherein the organic solid crystal comprises a dopant selected from the group consisting of platinum-octaethyl-porphyrin, bis [2-(2-pyridinyl-N)phenyl-C](acetylacetonato)iridium(III), Ir(ppy$_2$)acac), tris[2-(2-pyridinyl-kN)-5-(trifluoromethyl)phenyl-kC]iridium, Ir(p-CF$_3$-ppy)$_3$, fluorescein, rhodamine, and aminomethylcoumarin acetate.

12. The light-emitting diode of claim 11, wherein the organic solid crystal comprises a single crystal.

13. The light-emitting diode of claim 11, wherein the organic solid crystal comprises a hydrocarbon compound selected from the group consisting of anthracene, tetracene, phenanthrene, tolane, pyrene, corannulene, fluorene, biphenyl, and ter-phenyl.

14. The light-emitting diode of claim 11, wherein the organic solid crystal comprises a hydrocarbon selected from the group consisting of furan, pyrrole, thiophene, pyridine, pyrimidine, piperidine, quinolines, benzothiophenes, benzopyrans, bent and asymmetric acenes, 2,6-naphthalene dicarboxylic acid, and 2,6-dimethyl carboxylic esters.

15. The light-emitting diode of claim 11, wherein the organic solid crystal comprises a functional group selected from the group consisting of an amine, alcohol, and carboxylic acid.

16. A method comprising:

forming a primary electrode;

forming an organic solid crystal layer comprising an emissive dopant over the primary electrode; and forming a secondary electrode over the organic solid crystal layer and at least partially overlapping the primary electrode, wherein the organic solid crystal comprises a dopant selected from the group consisting of platinum-octaethyl-porphyrin, bis [2-(2-pyridinyl-N)phenyl-C](acetylacetonato)iridium(III), Ir(ppy$_2$) acac), tris[2-(2-pyridinyl-kN)-5-(trifluoromethyl)phenyl-kC]iridium, Ir(p-CF$_3$-ppy)$_3$, fluorescein, rhodamine, and aminomethylcoumarin acetate.

17. The method of claim 16, wherein the organic solid crystal layer comprises a single crystal.

* * * * *